United States Patent
Tao et al.

(10) Patent No.: US 11,216,098 B2
(45) Date of Patent: Jan. 4, 2022

(54) OLED DISPLAY PANEL AND METHOD FOR MANUFACTURING SAME, AND DISPLAY APPARATUS

(71) Applicants: FUZHOU BOE OPTOELECTRONICS TECHNOLOGY CO., LTD., Fujian (CN); BOE TECHNOLOGY GROUP CO., LTD, Beijing (CN)

(72) Inventors: Wenchang Tao, Beijing (CN); Zongxiang Li, Beijing (CN); Jin Wang, Beijing (CN); Zuwen Liu, Beijing (CN); Zhendian Wu, Beijing (CN); Linlin Lin, Beijing (CN); Guichun Hong, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/769,052

(22) PCT Filed: Dec. 13, 2019

(86) PCT No.: PCT/CN2019/125193
§ 371 (c)(1),
(2) Date: Jun. 2, 2020

(87) PCT Pub. No.: WO2020/140731
PCT Pub. Date: Jul. 9, 2020

(65) Prior Publication Data
US 2021/0232247 A1    Jul. 29, 2021

(30) Foreign Application Priority Data

Jan. 2, 2019   (CN) .......................... 201910002373.5

(51) Int. Cl.
*G06F 3/041*   (2006.01)
*G06F 3/044*   (2006.01)
*H01L 27/32*   (2006.01)

(52) U.S. Cl.
CPC .......... *G06F 3/0412* (2013.01); *G06F 3/0443* (2019.05); *G06F 3/04164* (2019.05);
(Continued)

(58) Field of Classification Search
CPC ............... G06F 3/0412; G06F 3/04164; G06F 2203/04111; G06F 3/0443; H01L 27/323
See application file for complete search history.

(56) References Cited

U.S. PATENT DOCUMENTS

2011/0102331 A1   5/2011  Philipp
2013/0162549 A1*  6/2013  Kim .................... G06F 3/0443
                                                             345/173
(Continued)

FOREIGN PATENT DOCUMENTS

CN    102053752 A      5/2011
CN    106444135 A  *   2/2017  ......... G02F 1/13338
(Continued)

OTHER PUBLICATIONS

First office action of Chinese application No. 201910002373.5 dated Jun. 5, 2020.
(Continued)

*Primary Examiner* — Sanjiv D. Patel
(74) *Attorney, Agent, or Firm* — Fay Sharpe LLP

(57) ABSTRACT

An OLED display panel is provided, including a pixel circuit layer, an OLED layer, and a reflective layer that are sequentially stacked, wherein the reflective layer includes at least one reflective block, and the at least one reflective block is a conductor and is connected to a touch integrated circuit.

18 Claims, 12 Drawing Sheets

(52) U.S. Cl.
CPC .. *H01L 27/323* (2013.01); *G06F 2203/04103* (2013.01); *G06F 2203/04111* (2013.01)

(56) References Cited

U.S. PATENT DOCUMENTS

| | | | |
|---|---|---|---|
| 2015/0220191 A1 | 8/2015 | Huh et al. | |
| 2016/0224153 A1* | 8/2016 | Bae | G06F 3/04164 |
| 2017/0278898 A1 | 9/2017 | Kim et al. | |
| 2018/0188866 A1* | 7/2018 | Heo | H01L 51/5253 |
| 2018/0196543 A1 | 7/2018 | Otagaki et al. | |

FOREIGN PATENT DOCUMENTS

| | | |
|---|---|---|
| CN | 206250196 U | 6/2017 |
| CN | 107104131 A | 8/2017 |
| CN | 107230746 A | 10/2017 |
| CN | 108268168 A | 7/2018 |
| CN | 108288633 A | 7/2018 |
| CN | 207867477 U | 9/2018 |
| CN | 109755278 A | 5/2019 |
| WO | WO2014098406 A1 | 6/2014 |

OTHER PUBLICATIONS

Hongjin Gao, New display technology, Beijing University of Posts and Telecommunications Press, Aug. 31, 2014, pp. 189-191.
International search report of PCT application No. PCT/CN2019/125193 dated Mar. 12, 2020.

* cited by examiner

OLED DISPLAY PANEL AND METHOD FOR MANUFACTURING SAME, AND DISPLAY APPARATUS

CROSS-REFERENCE TO RELATED APPLICATION

The present disclosure is a 371 of PCT Application No. PCT/CN2019/125193, filed on Dec. 13, 2019, which claims priority to Chinese Patent Application No. 201910002373.5, filed on Jan. 2, 2019 and titled "OLED DISPLAY PANEL AND METHOD FOR MANUFACTURING AND DRIVING THE SAME, AND DISPLAY APPARATUS", which is incorporated herein by reference in its entirety.

TECHNICAL FIELD

The present disclosure relates to the field of a display technology, and more particularly, to an OLED display panel and a method for manufacturing the same, and a display apparatus.

BACKGROUND

With the development of display technologies, the requirements for lighter and thinner display devices are increasingly higher, and the touch functions of the display devices are applied more and more widely.

SUMMARY

In one aspect, an OLED display panel is provided. The OLED display panel includes a pixel circuit layer, an OLED layer, and a reflective layer that are sequentially stacked, wherein the reflective layer includes at least one reflective block, and the at least one reflective block is a conductor and is connected to a touch integrated circuit.

In another aspect, a method for manufacturing an OLED display panel is provided. The method includes:
forming the OLED display panel, wherein a reflective layer of the OLED display panel includes at least one reflective block which is a conductor and is connected to a touch integrated circuit.

In yet another aspect, a display apparatus is provided. The display apparatus includes the OLED display panel aforesaid.

DETAILED DESCRIPTION

For clearer descriptions of the principles, technical solutions and advantages in the present disclosure, the implementation of the present disclosure is described in detail below in combination with the accompanying drawings.

With the development of display technologies, how to make a display apparatus with a touch function lighter and thinner has become a key research direction of people. The current touch display apparatus generally includes a display panel and a touch panel attached to the display panel. Such touch display apparatus is generally thick, and is increasingly unable to meet people's requirements for thinner and lighter display apparatuses. An embodiment of the present disclosure provides an organic light-emitting diode (OLED) display panel. The OLED display panel can have a touch function without the need for an additional touch panel. Further, the OLED display panel with the touch function can be made lighter and thinner.

Figure 1:
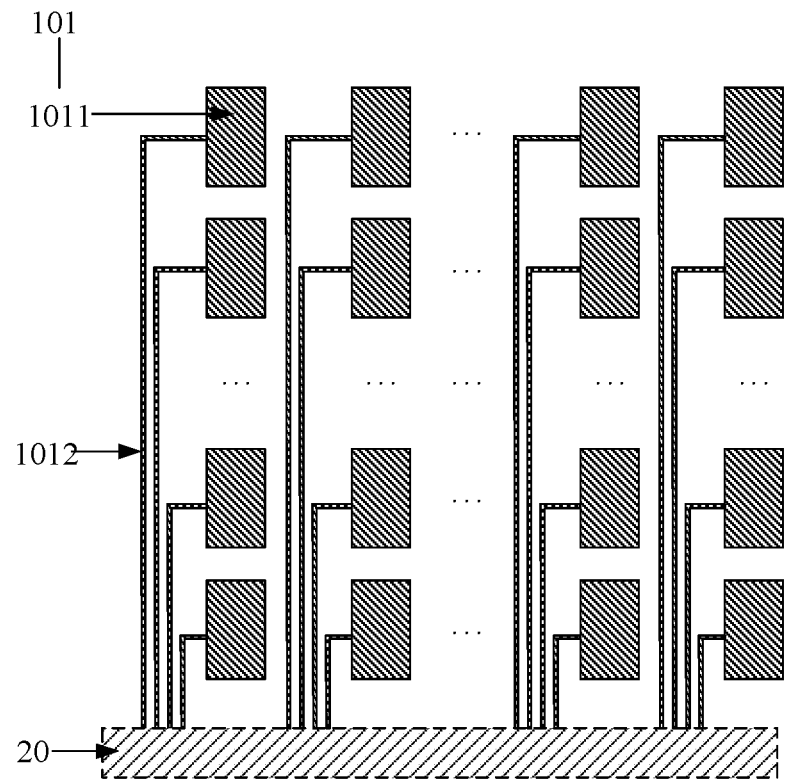
FIG. 1 is a schematic partial structural diagram of an OLED display panel provided by an embodiment of the present disclosure.

FIG. 1 is a schematic partial structural diagram of an OLED display panel provided by an embodiment of the present disclosure. The OLED display panel includes a pixel circuit layer (not shown in FIG. 1), an OLED layer (not shown in FIG. 1), and a reflective layer 101 that are sequentially stacked. As shown in FIG. 1, the reflective layer 101 may include at least one reflective block 1011 which is a conductor and may be connected to a touch integrated circuit 20. It should be noted that when the number of the reflective blocks in the at least one reflective block is greater than 1, the at least one reflective block 1011 may be spaced from each other. FIG. 1 only illustrates the reflective layer 101 in the OLED display panel, but does not show other film layer structures in the OLED display panel. In addition, FIG. 1 is shown by taking the case that the number of the reflective blocks in the at least one reflective block is greater than 1 as an example.

It should be noted that the reflective layer 101 may be a conductive non-transparent material, such as metal. The reflective layer 101 can reflect light emitted by the OLED layer in the OLED display panel, so that the light can also be used for the display of the OLED display panel, thereby improving the display brightness of the OLED display panel and reducing the power consumption. The at least one reflective block 1011 may form all or a part of the reflective layer 101, which is not limited in this embodiment of the present disclosure.

In summary, since the reflective layer of the OLED display panel in this embodiment of the present disclosure includes at least one reflective block connected to the touch integrated circuit, the touch integrated circuit may take the at least one reflective block as a touch electrode to achieve the touch function of the OLED display panel. Therefore, the OLED display panel can have a touch function without the need for an additional touch module, and the OLED display panel can be lighter and thinner.

Figure 2:
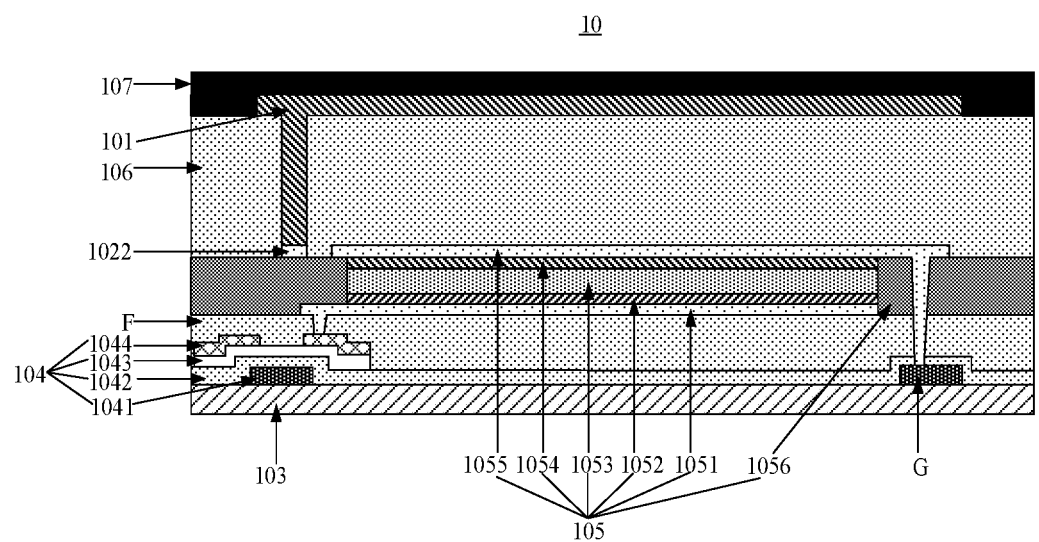
FIG. 2 is a schematic partial structural diagram of another OLED display panel provided by an embodiment of the present disclosure.

Optionally, as shown in FIG. 2, on the basis that the OLED display panel 10 includes the reflective layer 10, the OLED display panel 10 in this embodiment of the present disclosure may further include a first substrate 103 and an insulation layer 106. The pixel circuit layer 104, the OLED layer 105, the insulation layer 106 and the reflective layer 101 may be sequentially arranged in a direction away from the first substrate 103.

Further, the pixel circuit layer 104 may include a gate layer 1041, a gate insulation layer 1042, an active layer 1043 and a source-drain layer 1044 that are sequentially arranged in a direction away from the first substrate 103. The OLED layer 105 may include a pixel defining layer 1056, and an anode layer 1051, a hole transport layer 1052, an electroluminescent layer 1053, an electron transport layer 1054 and a cathode layer 1055 that are sequentially arranged in a direction away from the first substrate 103. Optionally, names of the anode layer 1051 and the cathode layer 1055 may be interchanged. For example, the anode layer 1051 is referred to as a cathode layer, and the cathode layer 1055 may be referred to as an anode layer. The pixel defining layer 1056 may define a plurality of sub-pixel regions. Each OLED (including an anode block in the anode layer, a hole transport block in the hole transport layer, an electroluminescent block in the electroluminescent layer, an electron transport block in the electron transport layer, and a cathode block in the cathode layer) in the OLED layer 105 may be located in one sub-pixel region. An auxiliary insulation layer F is also present between the pixel circuit layer 104 and the OLED layer 105, and the anode layer 1051 may be connected to the source-drain layer 1044 through a via hole in the auxiliary insulation layer F. In addition, FIG. 2 only illustrates a region where one sub-pixel in the OLED display panel is located.

Optionally, as shown in FIG. 2, the OLED display panel may further include a light shielding layer 107. The light shielding layer 107 may be located on one side of the reflective layer 101 away from the OLED layer 105 to prevent light emitted from the OLED layer from being emitted from a space between adjacent reflective blocks and prevent light leakage from the OLED display panel.

The OLED display panel with a touch function provided by the embodiment of the present disclosure may have plurality of implementable manners. The followings will be described for explanation by taking three implementable manners as examples.

In the first implementable manner of the OLED display panel, continuously referring to FIG. 1, the reflective layer 101 may further include at least one target connecting line 1012 connected to the at least one reflective block 1011 in a one-to-one correspondence manner, and the reflective block 1011 may be connected to the touch integrated circuit 20 through the target connecting line 1012 corresponding to the reflective block 1011. In this case, the reflective layer 101 may be located on one side of the pixel circuit layer in the OLED display panel away from the OLED layer; or the reflective layer 101 may also be located on one side of the OLED layer away from the pixel circuit layer, which is not limited in this embodiment of the present disclosure.

Optionally, the target connecting lines 1012 may be located in the same layer as the reflective layer 101. Of course, the target connecting lines 1012 may also be located in a different layer from the reflective layer 101. Alternatively, a part of the target connecting lines 1012 are located in the same layer as the reflective layer 101, and the other part of the target connecting lines 1012 are located in a different layer from the reflective layer 101. Exemplarily, when the target connecting lines 1012 are located in a different layer from the reflective layer 101, the target connecting lines 1012 may be located in the same layer as an electrode layer of the OLED layer in the OLED display panel close to the reflective layer 101; or the target connecting lines 1012 may also be located in the same layer as other conductive layers, which is not limited in this embodiment of the present disclosure.

This first implementable manner is equivalent to achieving a self-capacitive touch of the OLED display panel. The touch integrated circuit may determine a touch region of the OLED display panel just through the at least one reflective block. Exemplarily, the touch integrated circuit may provide a driving signal to the at least one reflective block, and collect a induction signal on the at least one reflective block, wherein the induction signal of the reflective block may be a voltage value on the reflective block. After that, the touch integrated circuit may determine an abnormal reflective block in which the induction signal is different from a target induction signal from the at least one reflective block, and then determine a region in the OLED display panel where the abnormal reflective block is located as the touch region. The above target induction signal may be a voltage value on the reflective block when the OLED display panel is not touched.

Figure 3:
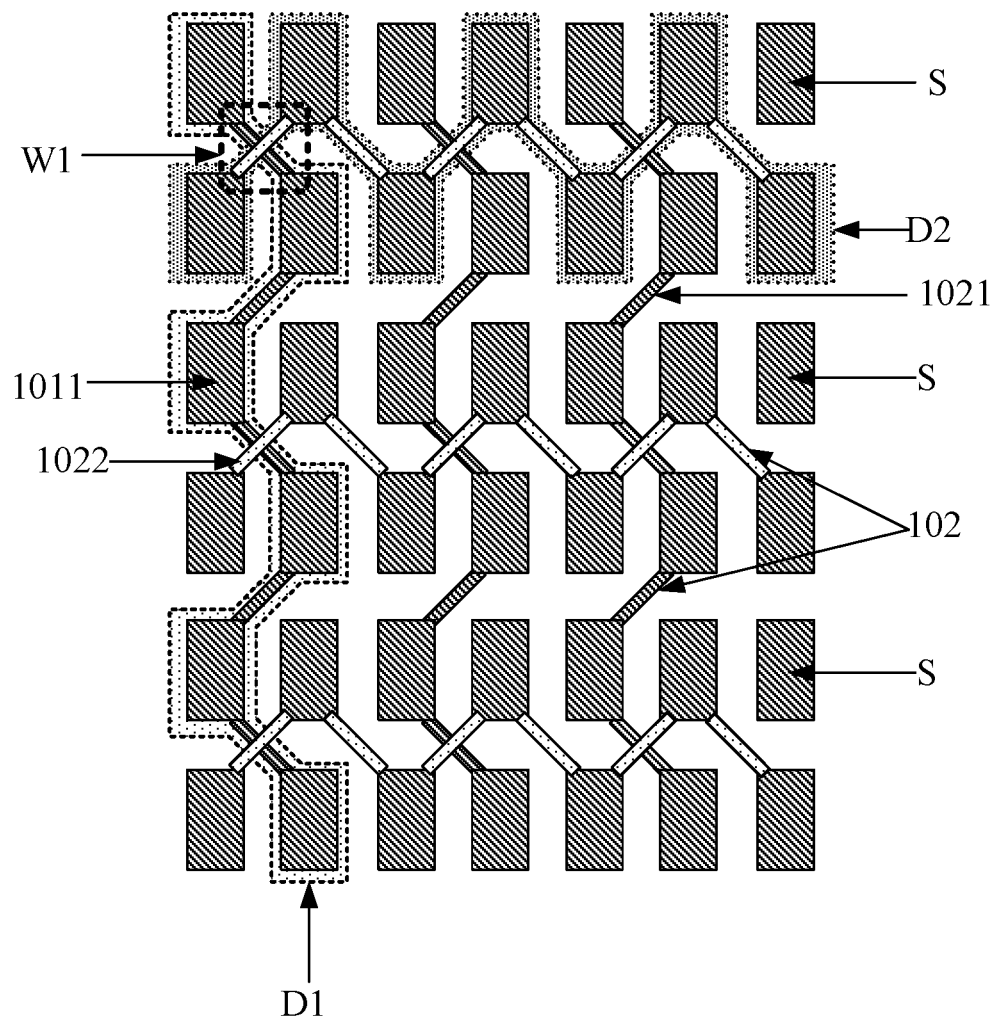
FIG. 3 is a schematic partial structural diagram of another OLED display panel provided by an embodiment of the present disclosure.

In the second implementable manner of the OLED display panel, referring to FIG. 3, in the case that the reflective layer 101 in the OLED display panel includes at least one reflective block 1011, if the number of the reflective blocks in the at least one reflective block is greater than 1, the OLED display panel may further include a plurality of first conductive bridges 1021 and a plurality of second conductive bridges 1022. It should be noted that FIG. 3 may show a part of the structure of the OLED display panel, which is not limited in this embodiment of the present disclosure.

Figure 4:
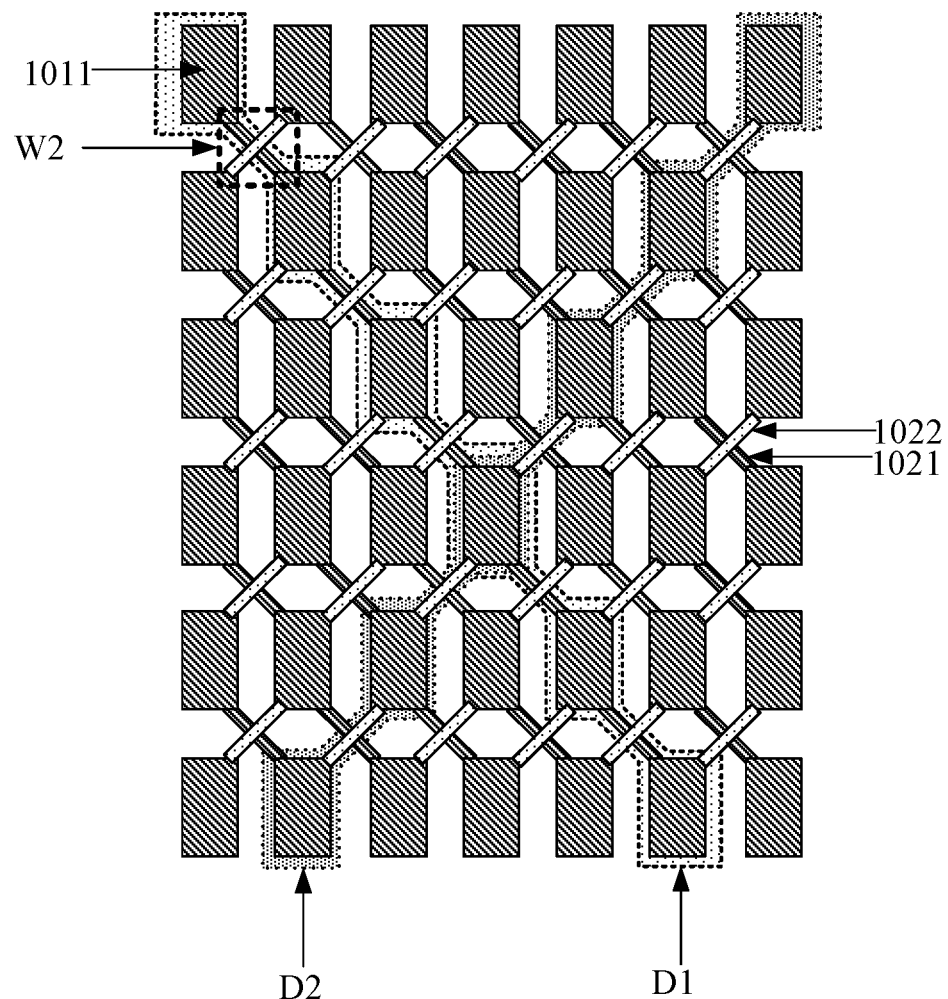
FIG. 4 is a schematic partial structural diagram of another OLED display panel provided by an embodiment of the present disclosure.

All the first conductive bridges 1021 and the second conductive bridges 1022 are located at a gap of the at least one reflective block 1011, and each of the first conductive bridges 1021 and the second conductive bridges 1022 connects two reflective blocks. The first conductive bridges 1021 are insulated from the second conductive bridges 1022, and at least a part of the first conductive bridges 1021 are intersected with at least a part of the second conductive bridges 1022. Exemplarily, FIG. 3 shows an intersection position W1 of one first conductive bridge 1021 and one second conductive bridge 1022. FIG. 4 shows an intersection position W2 of one first conductive bridge 1021 and one second conductive bridge 1022.

The first conductive bridges 1021 and the second conductive bridges 1022 may have a plurality of implementable manners. The followings will be described by taking two implementable manners as examples.

(1.1) In the first implementable manner of the first conductive bridges 1021 and the second conductive bridges 1022, as shown in FIG. 3, the reflective layer 101 includes m rows and n columns of reflective blocks 1011, in which m≥2, n≥2, and the at least one reflective block is at least a part of the reflective blocks in the m rows and n columns of reflective blocks. The reflective blocks 1011 in the odd-numbered rows among the reflective blocks 1011 in the $j^{th}$ column are connected to the reflective blocks 1011 in the even-numbered rows among the reflective blocks 1011 in the $(j+1)^{th}$ column through the first conductive bridges 1021, in which 1≤j≤n, and j is an odd number. The reflective blocks 1011 in the even-numbered columns among the reflective blocks 1011 in the $i^{th}$ row are connected to the reflective blocks 1011 in the odd-numbered columns among the reflective blocks 1011 in the $(i+1)^{th}$ row through the second conductive bridges 1022, in which 1≤i≤m, and i is an odd number.

Assuming that the reflective layer 101 includes 6 rows and 7 columns of reflective blocks as shown in FIG. 3, the reflective blocks in the odd-numbered rows among the reflective blocks in the first column are connected to the reflective blocks in the even-numbered rows in the second column through the first conductive bridges 1021; the reflective blocks in the odd-numbered rows among the reflective blocks in the third column are connected to the reflective blocks in the even-numbered rows in the fourth column through the first conductive bridges 1021; and the reflective blocks in the odd-numbered rows among the reflective blocks in the fifth column are connected to the reflective blocks in the even-numbered rows among the reflective blocks in the sixth column through the first conductive bridges 1021. The reflective blocks in the even-numbered columns among the reflective blocks in the first row are connected to the reflective blocks in the odd-numbered columns among the reflective blocks in the second row through the second conductive bridges 1022; the reflective blocks in the even-numbered columns among the reflective blocks in the third row are connected to the reflective blocks in the odd-numbered columns among the reflective blocks in the fourth row through the second conductive bridges 1022; and the reflective blocks in the even-numbered columns among the reflective blocks in the fifth row are connected to the reflective blocks in the odd-numbered columns among the reflective blocks in the sixth row through the second conductive bridges 1022.

The at least one reflective block is at least a part of the m rows and n columns of reflective blocks. If both m and n are even numbers, at least one reflective block is all of the m rows and n columns of reflective blocks. In this case, the reflective layer does not include any conductive blocks besides at least one reflective block. If there are odd numbers in m and n, at least one reflective block is a part of the m rows and n columns of reflective blocks. In this case, the reflective layer may include other reflective blocks (such as the reflective block indicated by S in FIG. 3) besides the at least one reflective block 1011. Exemplarily, if n is an odd number (as shown in FIG. 3), other reflective blocks which do not belong to the at least one reflective block 1011 are present in the reflective blocks in the last column. If m is an odd number, the remaining reflective blocks which do not belong to the at least one reflective block 1011 are present in the reflective blocks in the last row (i.e., this case is not shown in the drawings of the Description).

Further, the remaining reflective blocks may be separately connected to the touch integrated circuit, or may not be connected to the touch integrated circuit. In addition, since the area of the reflective blocks in the OLED display panel is generally small, and the remaining reflective blocks are generally located on edges of the OLED display panel, the touch control of the OLED display panel may not be affected even if the remaining reflective blocks are not connected to the touch integrated circuit.

Optionally, the m rows and n columns of reflective blocks obtained by dividing the reflective layer may be in one-to-one correspondence to all sub-pixels in the OLED display panel. An orthographic projection of each sub-pixel on an installation surface of the reflective block corresponding to the sub-pixel may be at least partially overlapped (e.g., partially overlapped or completely overlapped) with an orthographic projection of the reflective block on the installation surface, which is not limited in this embodiment of the present disclosure.

(1.2) In the second implementable manner of the first conductive bridges 1021 and the second conductive bridges 1022, at least one reflective block 1011 includes m rows and n columns of reflective blocks 1011, in which m≥2, n≥2. The reflective blocks 1011 in the $i^{th}$ row and the $j^{th}$ column are connected to the reflective blocks 1011 in the $(i+1)^{th}$ row and the $(j+1)^{th}$ column through the first conductive bridges 1021, and the reflective blocks 1011 in the $i^{th}$ row and the $(j+1)^{th}$ column are connected to the reflective blocks 1011 in the $(i+1)^{th}$ row and in the $j^{th}$ column through the second conductive bridges 1022, in which 1≤i≤m, 1≤j≤n. Exemplarily, referring to FIG. 4, assuming that the reflective layer 101 is divided into 6 rows and 7 columns of reflective blocks 1011. The reflective blocks 1011 in the first row and the first column are connected to the reflective blocks 1011 in the second row and the second column through the first conductive bridges 1021, and the reflective blocks 1011 in the first row and the second column are connected to the reflective blocks 1011 in the second row and the first column through the second conductive bridges 1022.

Further, the film layer where the first conductive bridges and the second conductive bridges are located may have a plurality of implementation manners. The followings will be described for explanation by taking four of these implementation manners as examples.

(2.1) in the first implementation manner of the film layer where the conductive bridges are located, the first conductive bridges 1021 are located in the same layer as the reflective layer 101, and the second conductive bridges 1022 are located in a different layer from the reflective layer 101. Optionally, the conductive bridge (such as the second conductive bridge 1022 in FIG. 3 and FIG. 4) in the first conductive bridges 1021 and the second conductive bridges 1022, which is located in a different layer from the reflective layer 101, may be in the same layer as a target conductive layer. The target conductive layer may be an electrode layer in the OLED layer of the OLED display panel close to the reflective layer 101. Of course, the target conductive layer may also be an electrode layer in the OLED layer of the OLED display panel away from the reflective layer 101, which is not limited in this embodiment of the present disclosure.

Figure 5:
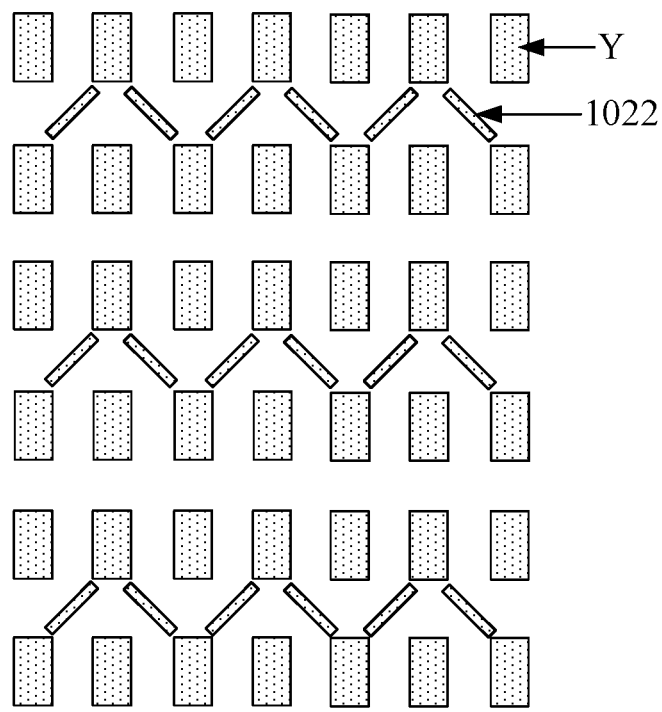
FIG. 5 is a schematic partial structural diagram of another OLED display panel provided by an embodiment of the present disclosure.
Figure 6:
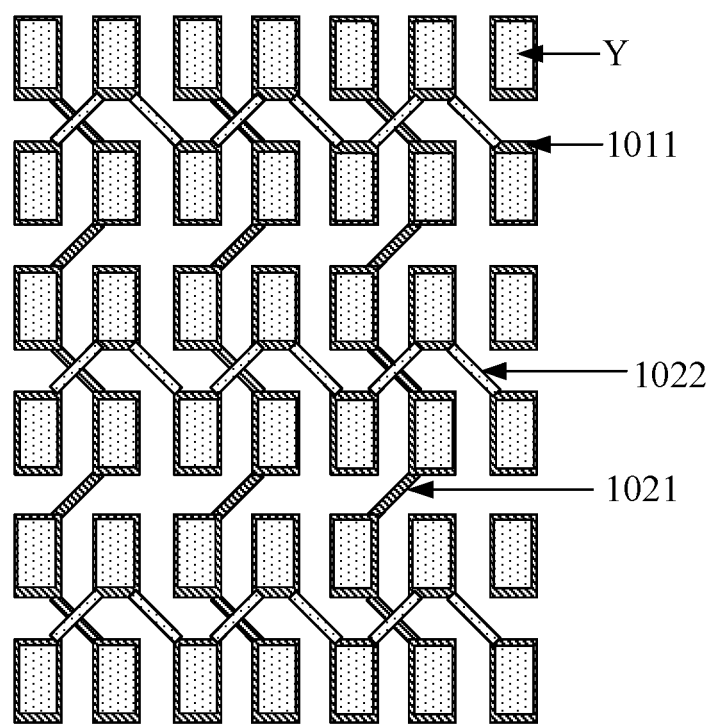
FIG. 6 is a schematic partial structural diagram of another OLED display panel provided by an embodiment of the present disclosure.

Exemplarily, when the OLED display panel is formed, if the implementation manner of the first conductive bridges 1021 and the second conductive bridges 1022 is the first implementation manner, the target electrode layer and the second conductive bridges 1022 may be formed at the same time so as to obtain a pattern as shown in FIG. 5. Then the reflective layer 101 and the first conductive bridges 1021 are formed at the same time so as to obtain the OLED display panel shown in FIG. 6. It should be noted that the OLED display panel shown in FIG. 6 is the same as the OLED display panel shown in FIG. 3. However, FIG. 6 is a view of the side where the target electrode layer is located, while FIG. 3 is a view of the side where the reflective layer is located.

It should be noted that the target conductive layer in the OLED display panel may include at least one electrode block Y. FIG. 6 takes a case that the target conductive layer includes a plurality of electrode blocks Y as an example. As shown in FIG. 6, the at least one electrode block Y in the target conductive layer may be in one-to-one correspondence to the at least one reflective block 1011 in the reflective layer, and an orthographic projection of the electrode block Y on an installation surface of the reflective layer is at least partially overlapped with an orthographic projection of the corresponding reflective block 1011 on the installation surface. The followings will be explained by taking the target conductive layer in this form as an example. Exemplarily, each electrode block Y may be rectangular. The area of each electrode block Y may be slightly smaller than the area of the reflective block 1011 corresponding to the electrode block Y. The orthographic projection of each electrode block Y on the installation surface of the reflective layer may be located within the orthographic projection of the corresponding reflective block 1011 on the installation surface. Optionally, each electrode block in the target conductive layer may also be in other shapes (such as a diamond or a circle). The electrode blocks may not correspond to the reflective blocks in the reflective layer. The position and area of each electrode block may also be unrelated to the position and area of each reflective block, which is not limited in this embodiment of the present disclosure.

Figure 7:
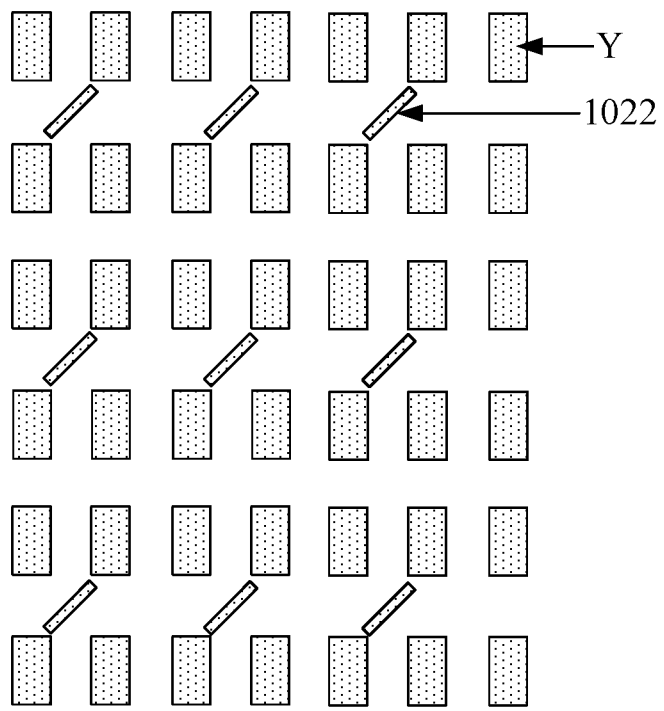
FIG. 7 is a schematic partial structural diagram of another OLED display panel provided by an embodiment of the present disclosure.

(2.2) In the second formation manner of the film layer where the conductive bridges are located, the first conductive bridges 1021 and the non-intersected second conductive bridges are located in the same layer as the reflective layer, and the intersected second conductive bridges are located on a different layer from the reflective layer 101. The intersected second conductive bridges are second conductive bridges 1022 that are intersected with the first conductive bridges 1021, and the non-intersected second conductive bridges are second conductive bridges 1022 that are not intersected with the first conductive bridges 1021. Optionally, the conductive bridges which are located in a different layer from the reflective layer may be located in the same layer as the target conductive layer. The explanation of the target conductive layer may refer to the foregoing embodiments, and will not repeated in this embodiment of the present disclosure. Exemplarily, when the OLED display panel is formed, if the implementation manner of the first conductive bridges 1021 and the second conductive bridges 1022 is the first implementation manner, the target electrode layer and the second conductive bridges 1022 may be formed at the same time so as to obtain a pattern as shown in FIG. 7. Then the reflective layer, the first conductive bridges 1021 and the non-intersected second conductive bridges are formed at the same time so as to obtain the OLED display panel shown in FIG. 6.

(2.3) In the third formation manner of the film layer where the conductive bridges are located, the second conductive bridges are located in the same layer as the reflective layer, and the first conductive bridges are located on a different layer from the reflective layer. Optionally, the conductive bridges which are located in a different layer from the reflective layer may also be located in the same layer as the above target conductive layer. The explanation of the target conductive layer may refer to the foregoing embodiments, and is not repeated in this embodiment of the present disclosure. Exemplarily, when the OLED display panel is formed, if the implementation manner of the first conductive bridges 1021 and the second conductive bridges 1022 is the first implementation manner, the target electrode layer and the first conductive bridges may be formed at the same time, and the reflective layer 101 and the second conductive bridges 1021 are formed at the same time.

(2.4) In the fourth formation manner of the film layer where the conductive bridges are located, the second conductive bridges and the non-intersected first conductive bridges are located in the same layer as the reflective layer, and the intersected first conductive bridges are located on a different layer from the reflective layer. The intersected first conductive bridges are the first conductive bridges which are intersected with the second conductive bridges. Optionally, the conductive bridges which are located in a different layer from the reflective layer may be located in the same layer as the target conductive layer. The explanation of the target conductive layer may refer to the foregoing embodiments, and is not repeated in this embodiment of the present disclosure. Exemplarily, when the OLED display panel is formed, if the implementation manner of the first conductive bridges 1021 and the second conductive bridges 1022 is the first implementation manner, the target conductive layer and the intersected first conductive bridges may be formed at the same time, and the reflective layer, the second conductive bridges and the non-intersected first conductive bridges are formed at the same time.

Figure 8:
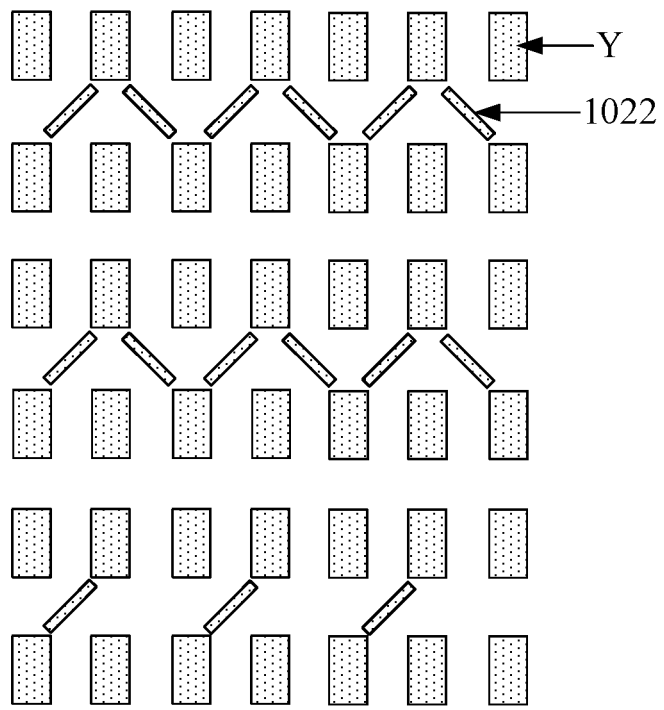
FIG. 8 is a schematic partial structural diagram of another OLED display panel provided by an embodiment of the present disclosure.

(2.5) In the fifth formation manner of the film layer where the conductive bridges are located, the first conductive bridges 1021 and a part of the non-intersected second conductive bridges are located in the same layer as the reflective layer, and the intersected second conductive bridges and the other part of the non-intersected second conductive bridges are located in a different layer from the reflective layer 101. The intersected second conductive bridges, the non-intersected second conductive bridges and the conductive bridges in a different layer from the reflective layer may refer to the foregoing embodiments, and are not repeated in this embodiment of the present disclosure. Exemplarily, when the OLED display panel is formed, if the implementation manner of the first conductive bridges 1021 and the second conductive bridges 1022 is the first implementation manner, the target conductive layer, the intersected second conductive bridges and the other part of the non-intersected conductive bridges may be formed at the same time so as to obtain a pattern as shown in FIG. 8, and the reflective layer, the first conductive bridges 1021 and the part of the above-mentioned non-intersected second conductive bridges are formed at the same time.

(2.6) In the sixth formation manner of the film layer where the conductive bridges are located, the second conductive bridges and a part of the non-intersected first conductive bridges are located in the same layer as the reflective layer, and the intersected first conductive bridges and the other part of the non-intersected first conductive bridges are located on a different layer from the reflective layer. The intersected first conductive bridges, the non-intersected first conductive bridges and the conductive bridges in a different layer from the reflective layer may refer to the foregoing embodiments, and are not repeated in this embodiment of the present disclosure. Exemplarily, when the OLED display panel is formed, if the implementation manner of the first conductive bridges 1021 and the second conductive bridges 1022 is the first implementation manner, the target conductive layer, the intersected first conductive bridges and the other part of the non-intersected first conductive bridges may be formed at the same time, and the reflective layer, the second conductive bridges and the part of the above-mentioned non-intersected first conductive bridges are formed at the same time.

In addition, in the second implementable manner of the OLED display panel, the plurality of first conductive bridges 1021 and the reflective blocks 1011 connected thereto form at least one first conductive structure D1 (as shown in FIG. 3 or FIG. 4), and the plurality of second conductive bridges 1022 and the reflective blocks 1011 connected thereto form at least one second conductive structure D2 (as shown in FIG. 3 or FIG. 4). In this case, the OLED display panel may further include at least one first connecting line and at least one second connecting line which are connected to the touch integrated circuit. The at least one first connecting line may be connected to the at least one first conductive structure D1 in a one-to-one correspondence manner, and the at least one second connecting line may be connected to at least one second conductive structure D2 in a one-to-one correspondence manner.

It should be noted that the film layer on which the at least one first connecting line and the at least one second connecting line are located may also have a plurality of implementation manners. The followings will be described for explanation by taking only three implementation manners as examples.

(3.1) In the first implementation manner of the film layer where the connecting lines are located, in the at least one first connecting line and the at least one second connecting line, a part of the connecting lines are located in the same layer as the reflective layer, and the other part of the connecting lines are located in a different layer from the reflective layer. It can be seen that the part of the connecting lines are formed in the same layer as the reflective layer, and the other part of the connecting lines are formed in a different layer from the reflective layer. The connecting line in a different layer from the reflective layer may be located in the same layer as the above target conductive layer. The explanation of the above target conductive layer may refer to the foregoing embodiments, and is not repeated in this embodiment of the present disclosure.

Figure 9:
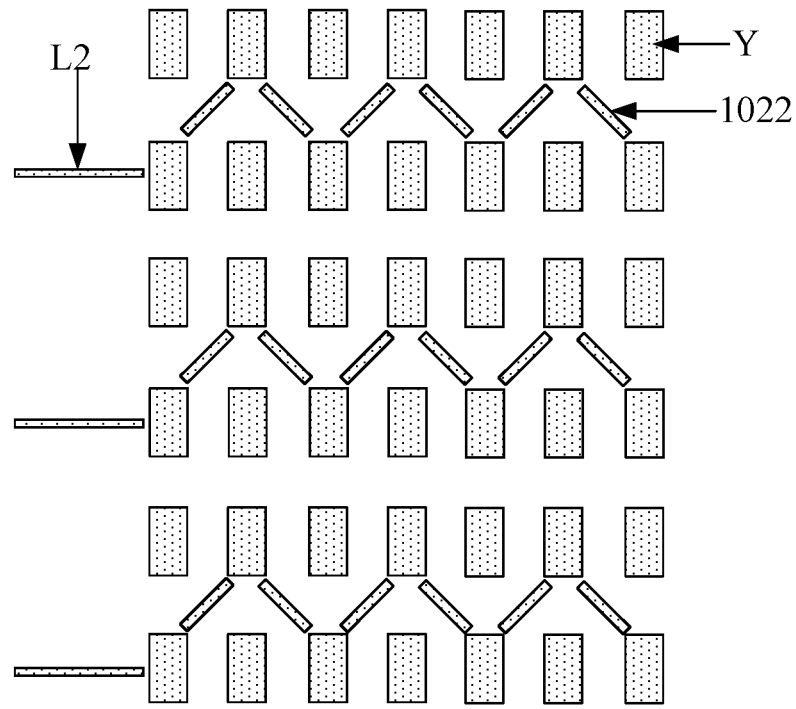
FIG. 9 is a schematic partial structural diagram of another OLED display panel provided by an embodiment of the present disclosure.
Figure 10:
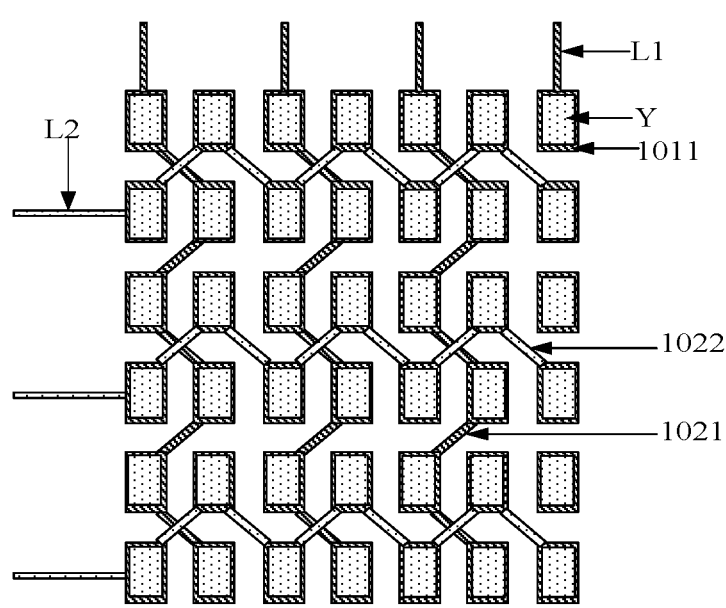
FIG. 10 is a schematic partial structural diagram of another OLED display panel provided by an embodiment of the present disclosure.

Exemplarily, it is assumed that, in the at least one first connecting line and the at least one second connecting line, the first connecting lines are located in the same layer as the reflective layer, and the second connecting lines are located in a different layer from the reflective layer. When the OLED display panel shown in FIG. 3 is manufactured, the target conductive layer, the second conductive bridges and the second connecting lines may be formed at the same time to obtain a pattern shown in FIG. 9; and then the reflective layer, the first conductive bridges and the first connecting lines are formed at the same time so as to obtain the OLED display panel shown in FIG. 10.

Optionally, the part of the connecting lines may also include a part of the first connecting lines, and the other part of the connecting lines may also include the other part of the first connecting lines and all the second connecting lines; or the part of the connecting lines may include a part of the second connecting lines, and the other part of the connecting lines may include the other part of the second connecting lines and all the first connecting lines, which are not defined in this embodiment of the present disclosure.

Figure 11:
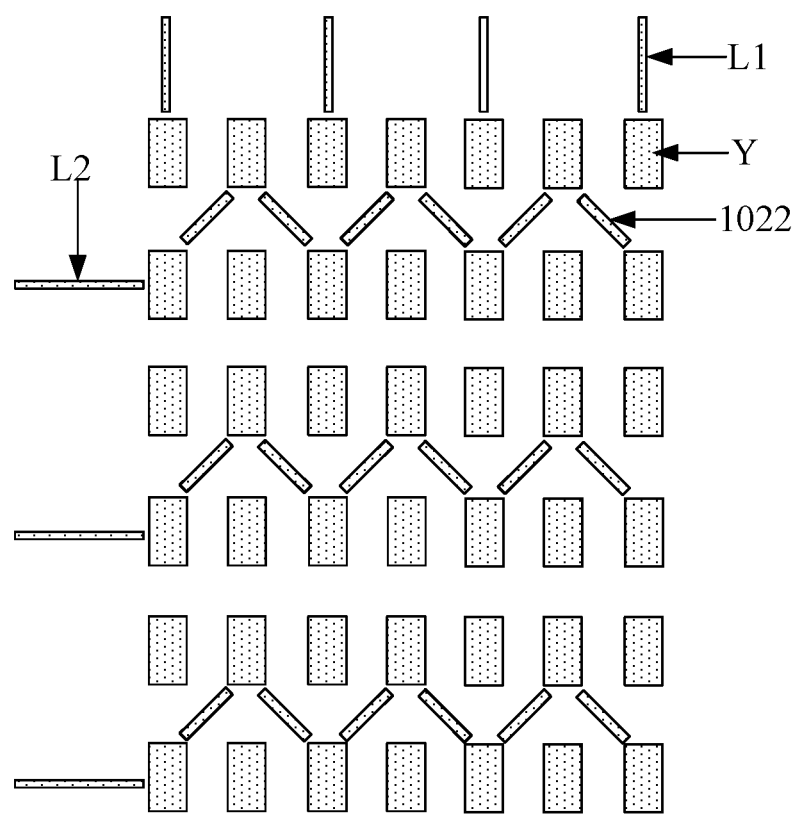
FIG. 11 is a schematic partial structural diagram of another OLED display panel provided by an embodiment of the present disclosure.

(3.2) in the second implementation manner of the film layer where the connecting lines are located, at least one first connecting line and the at least one second connecting line are both located in the same layer as the reflective layer. When the OLED display panel shown in FIG. 3 is manufactured, the reflective layer, the first conductive bridges, the first connecting lines and the second connecting lines may be formed at the same time to obtain a pattern shown in FIG. 11; and the target conductive layers and the second conductive bridges are formed at the same time.

(3.3) In the third implementation manner of the film layer where the connecting lines are located, at least one first connecting line and the at least one second connecting line are both located in a different layer from the reflective layer. Exemplarily, at least one first connecting line and at least one second connecting line are both located in the same layer as the target conductive layer. The explanation of the target conductive layer may refer to the foregoing embodiments. When the OLED display panel shown in FIG. 3 is manufactured, the target conductive layer, the second conductive bridges, the first connecting lines and the second connecting lines may be formed at the same time, and the reflective layer and the first conductive bridges are formed at the same time.

This second implementable manner of the OLED display panel is equivalent to achieving a mutually-capacitive touch control of the OLED display panel. The touch integrated circuit may determine a touch region of the OLED display panel just through the plurality of reflective blocks. Exemplarily, the touch integrated circuit may provide a driving signal to at least one first conductive structure and at least one second conductive structure, and collect a induction signal on each conductive structure to determine an abnormal conductive structure. The induction signal of each conductive structure may be a voltage value on the conductive structure. The induction signal collected from each abnormal conductive structure is different from the target induction signal. The target induction signal may be a voltage value on the reflective block when the OLED display panel is not touched. Next, the touch integrated circuit may determine the intersection position between the abnormal conductive structures, and determine a touch region of the OLED display panel according to the intersection position.

In the third implementable manner of the OLED display panel, on the premise that the reflective layer 101 includes at least one reflective block 1011 connected to the touch integrated circuit, the OLED display panel includes a target conductive layer insulated from the reflective layer 101, and the target conductive layer includes at least one electrode block connected to the touch integrated circuit. In this case, the touch integrated circuit may determine the touch region of the OLED display panel through at least one reflective block 1011 in the reflective layer and at least one electrode block in the target conductive layer together. The target conductive layer may be any conductive layer insulated from the reflective layer 101 in the OLED display panel, such as the conductive layer in the OLED layer close to the reflective layer.

The electrode blocks may have a plurality of implementation manners. The following will be described for explanation by taking two implementation manners as examples.

(4.1) In the first implementation manner of the electrode blocks, the at least one electrode block is in one-to-one correspondence to the at least one reflective block, and an orthographic projection of the electrode block on an installation surface of the reflective layer is at least partially overlapped with an orthographic projection of the corresponding reflective block on the installation surface. In this case, the reflective layer may be as shown in FIG. 1. The target conductive layer may be the same as the target conductive layer shown in any of FIG. 5 to FIG. 11. The descriptions of the target conductive layer may refer to the descriptions in the introduction of the target conductive layer in FIG. 5 and FIG. 6, and are not repeated in this embodiment of the present disclosure.

Figure 12:
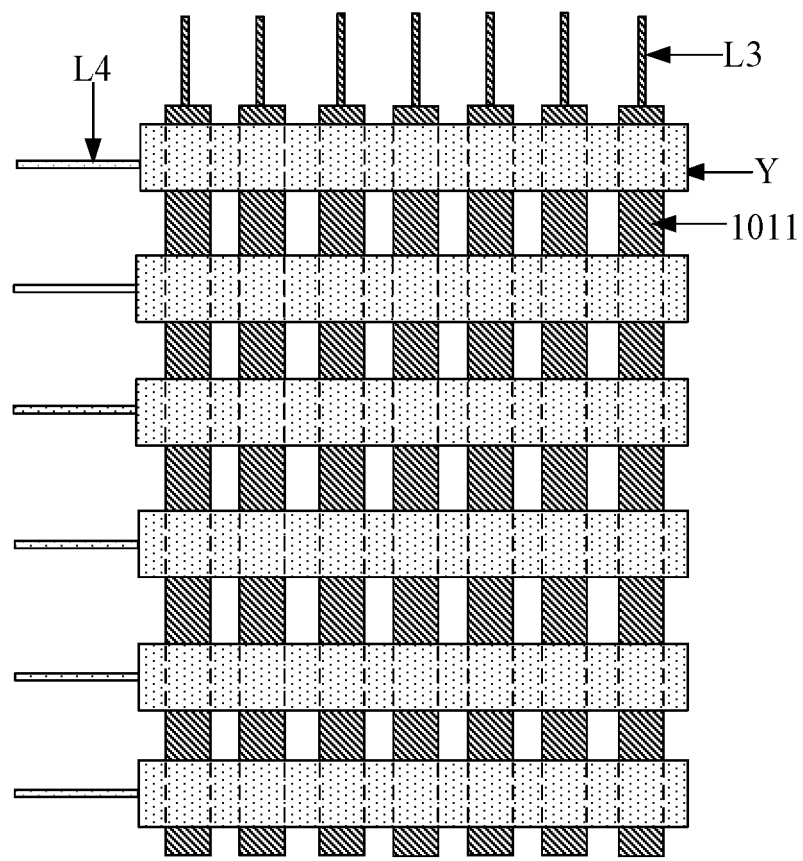
FIG. 12 is a schematic partial structural diagram of another OLED display panel provided by an embodiment of the present disclosure.

(4.2) In the second implementation manner of the electrode blocks, the electrode blocks and the reflective blocks are in the shape of strips, and an orthographic projection of each electrode block on an installation surface of the reflective layer is at least partially overlapped with an orthographic projection of each reflective block on the installation surface. It can be considered that each electrode block corresponds to each reflective block. Exemplarily, referring to FIG. 12, the plurality of electrode blocks Y in the target conductive layer may all have the shape of stripes and are arranged in parallel. The plurality of reflective blocks 1011 in the reflective layer may also have the shape of stripes and are arranged in parallel. Moreover, an angle between a length direction of each electrode block Y and a length direction of the corresponding reflective block 1011 is greater than 0. FIG. 12 takes the case that the angle is 90 degrees as an example. An orthographic projection of each electrode block Y on an installation surface of the reflective layer is at least partially overlapped with an orthographic projection of the at least one reflective block 1011 on the installation surface.

In the above two implementation manners of the electrode blocks, each reflective block in the reflective layer may be connected to the touch integrated circuit through the target connecting line corresponding to the reflective block. As shown in FIG. 12, the reflective block 1011 may be connected to the touch integrated circuit through a target connecting line L3, and the touch integrated circuit is not shown in FIG. 12. The OLED display panel further includes at least one electrode connecting line in one-to-one correspondence to the at least one electrode block, wherein the electrode block is connected to the touch integrated circuit through the corresponding target connecting line. As shown in FIG. 12, the electrode block Y may be connected to the touch integrated circuit through a connecting line L4. Optionally, when the target conductive layer is the above-mentioned cathode layer, since the cathode layer is connected to a common electrode G in the OLED display panel (as shown in FIG. 2), the OLED display panel may not include electrode connecting lines. In addition, the plurality of electrode blocks in the target conductive layer may be connected to the touch integrated circuit through the common electrode G, which is not limited in this embodiment of the present disclosure.

Optionally, the target conductive layer and the reflective layer in the OLED display panel may be located on the same substrate. Referring to FIG. 2, the target conductive layer 1055 and the reflective layer 101 in the OLED display panel are both located on the first substrate 103 and insulated by an insulation layer 106. In this case, a connecting line connecting the reflective block or the electrode block to the touch integrated circuit may be formed in the same layer as the reflective layer, or may be formed in the same layer as the target conductive layer.

Alternatively, the target conductive layer and the reflective layer in the OLED display panel may be located on different substrates. In this case, a target connecting line connecting the reflective block in the reflective layer to the touch integrated circuit may be formed in the same layer as the reflective layer, or an electrode connecting line connecting the electrode block to the touch integrated circuit may be formed in the same layer as the target conductive layer.

Figure 13:
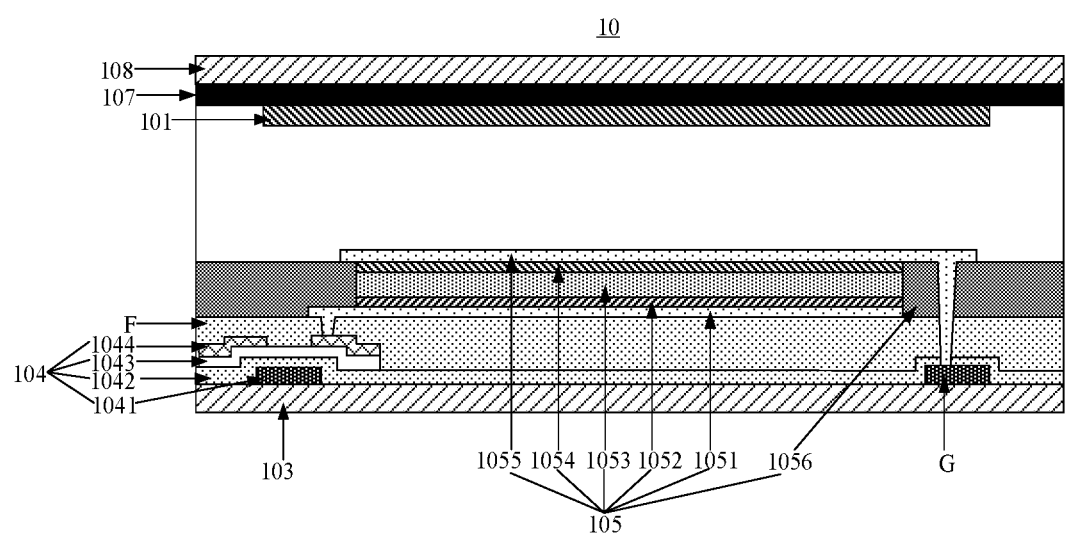
FIG. 13 is a schematic partial structural diagram of another OLED display panel provided by an embodiment of the present disclosure.

Exemplarily, referring to FIG. 13, the OLED display panel 10 may include: a first substrate 103 and a second substrate 108 which are disposed oppositely, and a pixel circuit layer 104, an OLED layer 105, a reflective layer 101 and a light shielding layer 107 which are located between the first substrate 103 and the second substrate 108. The pixel circuit layer 104 and the OLED layer 105 may refer to the introductions in FIG. 2, and are not repeated in this embodiment of the present disclosure. The light shielding layer 107 and the reflective layer 101 may be sequentially arranged in a direction away from the second substrate 108. The cathode layer 1055 in the OLED layer 105 is close to the reflective layer 101, and there is a gap between the cathode layer 1055 and the reflective layer 101. It should be noted that FIG. 13 only illustrates a region where one pixel is located in the OLED display panel.

The third implementable manner of the OLED display panel is equivalent to achieving a mutually-capacitive touch control of the OLED display panel. It is required to combine the reflective blocks in the reflective layer and the electrode blocks in the target conductive layer for the touch integrated circuit to determine the touch region of the OLED display panel. Exemplarily, each electrode block and each corresponding reflective block may form a coupling capacitor. The touch integrated circuit may sequentially provide a driving signal to the at least one electrode block, and after that, collect a induction signal on the reflective block corresponding to the electrode block, so as to determine a capacitor whose capacitance changes in the coupling capacitor composed of the each electrode block and the corresponding reflective block. Then, a region where the capacitor whose capacitance changes is located may be determined as the touch region of the OLED display panel.

In summary, since the reflective layer of the OLED display panel in this embodiment of the present disclosure includes at least one reflective block connected to the touch integrated circuit, the touch integrated circuit may take the at least one reflective block as a touch electrode to achieve the touch function of the OLED display panel. Therefore, the OLED display panel can have a touch function without the need for an additional touch module, and the OLED display panel can be lighter and thinner.

Figures 14, 15:
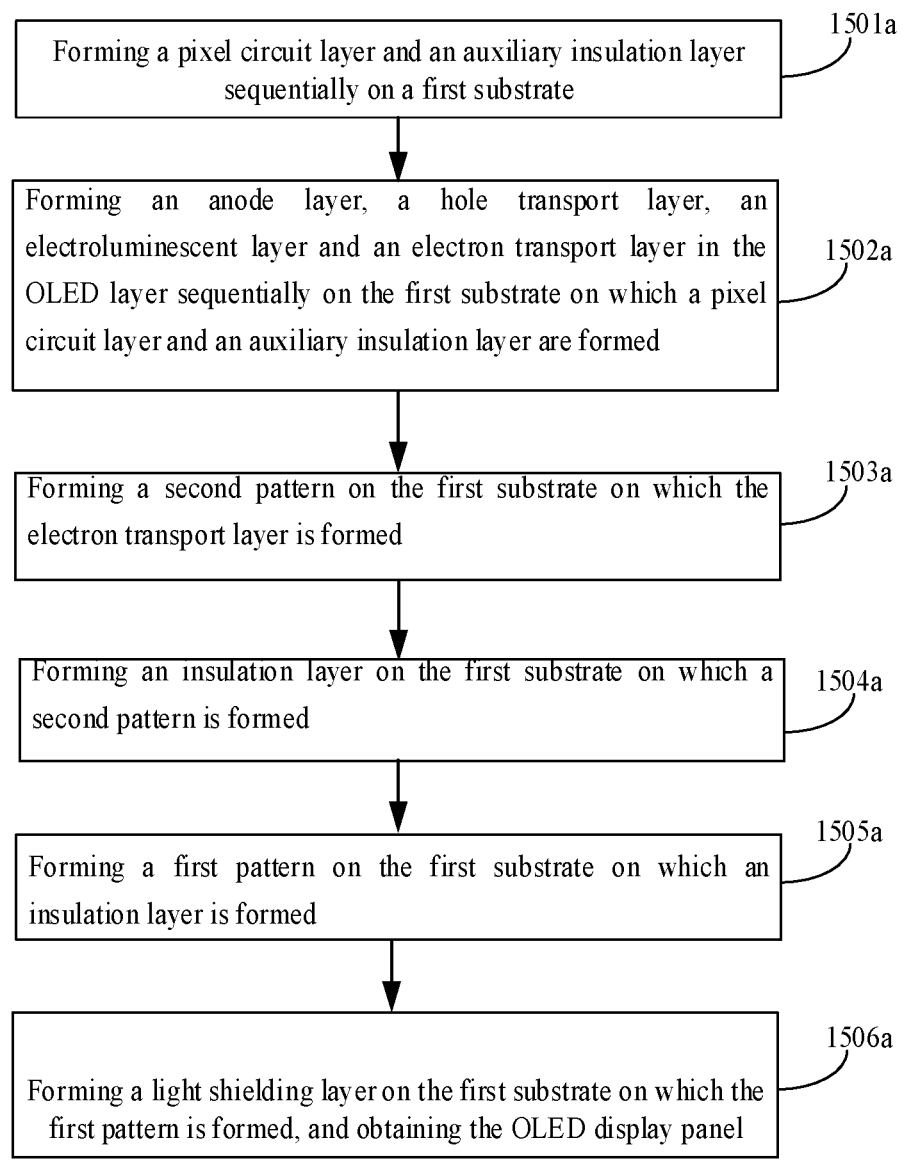
FIG. 14 is a flowchart of a manufacturing method for an OLED display panel provided by an embodiment of the present disclosure.
FIG. 15 is a flowchart of a manufacturing method for another OLED display panel provided by an embodiment of the present disclosure.

FIG. 14 is a flowchart of a manufacturing method for an OLED display panel provided by an embodiment of the present disclosure. This method can be used to manufacture the OLED display panel shown in any of FIGS. 1 to 13. As shown in FIG. 14, the method may include the following step.

In step 140, an OLED display panel is formed, wherein a reflective layer of the OLED display panel includes at least one reflective block which is a conductor and is connected to a touch integrated circuit.

In summary, since the reflective layer of the OLED display panel manufactured by the method provided by the embodiment of the present disclosure includes at least one reflective block connected to the touch integrated circuit, the touch integrated circuit may take the at least one reflective block as a touch electrode to achieve the touch function of the OLED display panel. Therefore, the OLED display panel can have a touch function without the need for an additional touch module, and the OLED display panel can be lighter and thinner.

FIG. 15 is a flowchart of a manufacturing method for another OLED display panel provided by an embodiment of the present disclosure. This method can be used to manufacture the OLED display panel shown in FIG. 2. As shown in FIG. 15, the method may include the following steps.

In step 1501a, a pixel circuit layer and an auxiliary insulation layer are sequentially formed on a first substrate.

Figure 16:
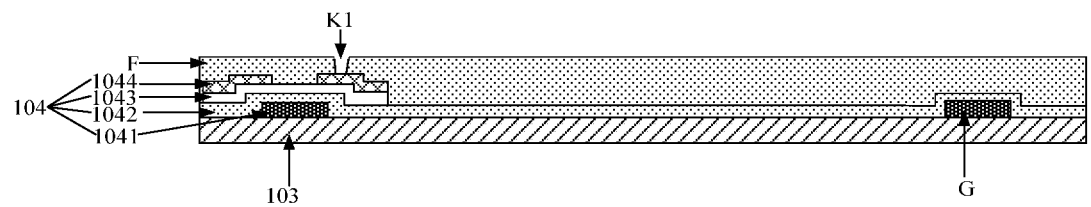
FIG. 16 is a schematic partial structural diagram of another OLED display panel provided by an embodiment of the present disclosure.

The pixel circuit layer may include a gate layer, a gate insulation layer, an active layer, and a source-drain layer. Exemplarily, a gate layer 1041, a gate insulation layer 1042, an active layer 1043, a source-drain layer 1044 and an auxiliary insulation material layer may be sequentially formed on the first substrate 103, and a common electrode G may be formed when the gate layer 1041 is formed. Next, a plurality of via holes K1 may be formed in the auxiliary insulation material layer to obtain an auxiliary insulation layer F, and the source-drain layer 1044 at the via hole K1 is exposed, thereby obtaining the structure shown in FIG. 16. FIG. 16 illustrates only one via hole K1 among the plurality of via holes K1.

In step 1502a, an anode layer, a hole transport layer, an electroluminescent layer and an electron transport layer in the OLED layer are sequentially formed on the first substrate on which the pixel circuit layer and the auxiliary insulation layer are formed.

Exemplarily, an anode layer 1051, a hole transport layer 1052, an electroluminescent layer 1053 and an electron transport layer 1054 may be sequentially formed on the structure shown in FIG. 16. In this case, the anode layer 1051 may be connected to the source-drain layer 1044 through the via hole in the auxiliary insulation layer F.

Optionally, the OLED layer may further include a pixel defining layer for defining a plurality of pixel regions. Before the anode layer 1051 is formed, it is also possible to first form a pixel defining layer 1056 on the structure shown in FIG. 16, and then form the anode layer 1051, the hole transport layer 1052, the electroluminescent layer 1053 and the electron transport layer 1054 in each pixel region. After the pixel defining layer 1056 is formed, a via hole K2 that runs through the pixel defining layer 1056, the auxiliary insulation layer F and the gate insulation layer 1042 at the same time may be formed, such that the common electrode G at the via hole K2 is exposed, and thus obtain the structure shown in FIG. 17.

In step 1503a, a second pattern is formed on the first substrate on which the electron transport layer is formed.

The second pattern may include a cathode layer. When the cathode layer is the target conductive layer, if the OLED display panel includes a structure in the same layer as the cathode layer, the second pattern may further include a structure in the same layer as the cathode layer. The explanation of the structure may refer to the foregoing embodiments, and is not repeated in this embodiment of the present disclosure. Exemplarily, the second pattern may be a pattern of a layer where the target electrode layer is located as shown in any of FIG. 5, FIG. 7, FIG. 8, FIG. 11, or FIG. 12.

Figure 17:
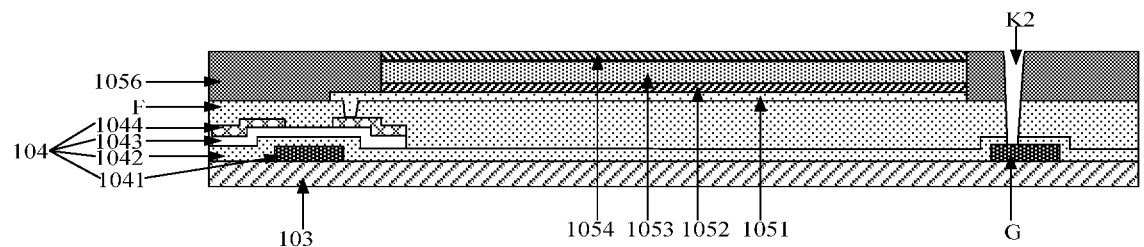
FIG. 17 is a schematic partial structural diagram of another OLED display panel provided by an embodiment of the present disclosure.
Figure 18:
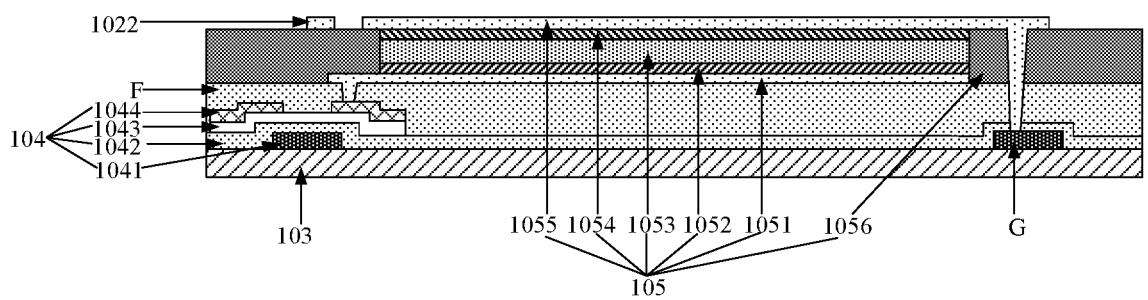
FIG. 18 is a schematic partial structural diagram of another OLED display panel provided by an embodiment of the present disclosure.

Exemplarily, the second pattern may be formed on the structure shown in FIG. 17 to obtain the structure shown in FIG. 18, wherein the second pattern is not marked in FIG. 18. The cathode layer 1055 in the second pattern may be connected to the common electrode G through the via holes K2 in the pixel defining layer 1056 and the auxiliary insulation layer F.

In step 1504a, an insulation layer is formed on the first substrate on which the second pattern is formed.

Figure 19:
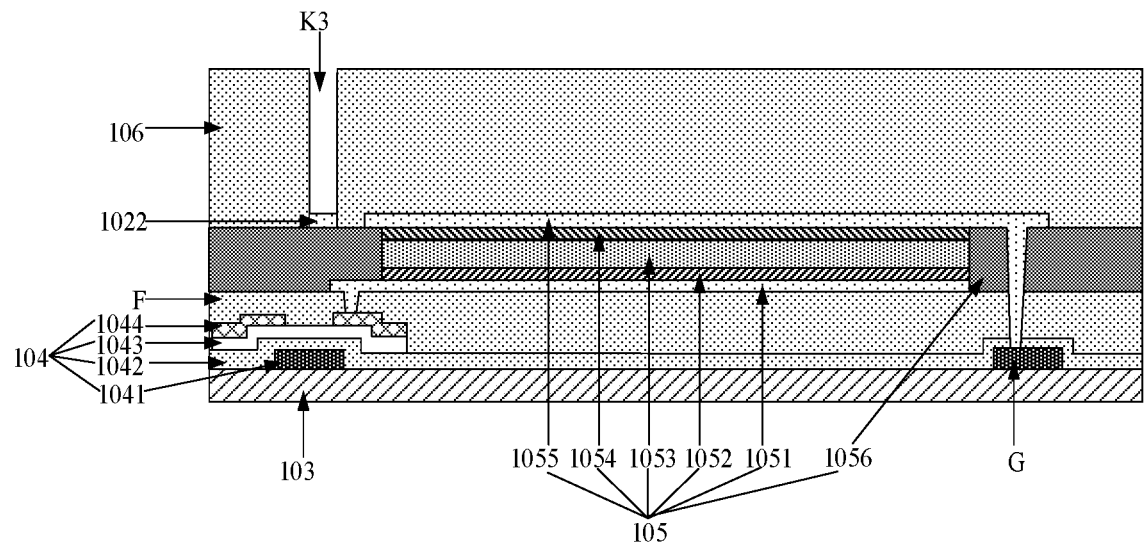
FIG. 19 is a schematic partial structural diagram of another OLED display panel provided by an embodiment of the present disclosure.

Exemplarily, an insulation material layer may be formed on the structure shown in FIG. 18. If the second pattern includes any one of a first connecting strip and the second connecting strip (FIG. 18 takes the case that the second pattern includes the second connecting strip as an example), a via hole K3 is formed in the insulation material layer, so that both ends of the any connecting strip are exposed to obtain the insulation layer 106, thereby forming the structure shown in FIG. 19. FIG. 19 only illustrates one formed via hole K3. The number of the via holes K3 is not limited in this embodiment of the present disclosure. If the second pattern does not include any one of the above-mentioned connecting strips, it is unnecessary to form the via hole K3 in the insulation material layer, and the insulation material layer is the insulation layer (this case is not shown in the drawings of the description).

In step 1505a, a first pattern is formed on the first substrate on which the insulation layer is formed.

Figure 20:
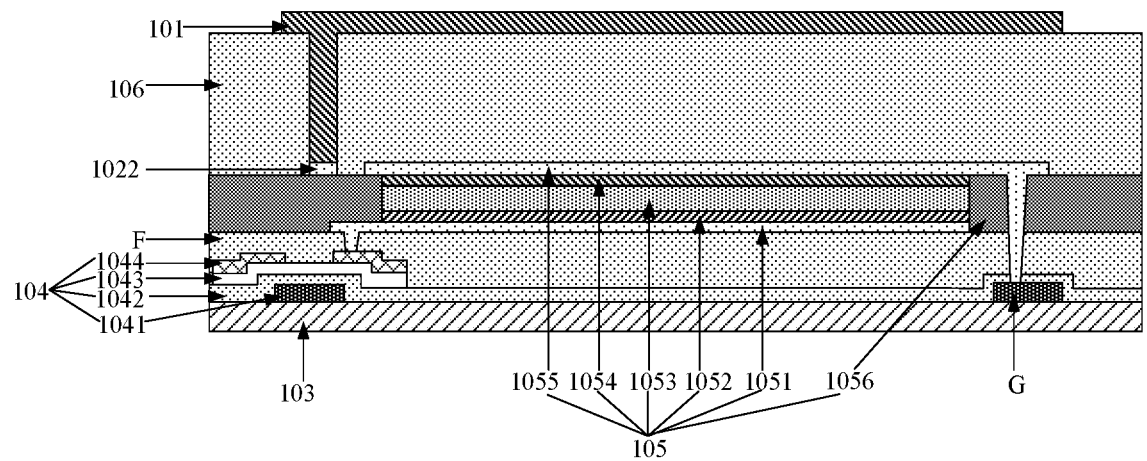
FIG. 20 is a schematic partial structural diagram of another OLED display panel provided by an embodiment of the present disclosure.

Exemplarily, the first pattern may be formed on the structure shown in FIG. 19 to obtain the structure shown in FIG. 20, wherein the first pattern is not marked in FIG. 20. It should be noted that the first pattern formed in step 1505a needs to match the second pattern formed in step 1503a. Exemplarily, the first pattern includes a reflective layer, and a structure in the same layer as the reflective layer. The structure in the same layer as the reflective layer may refer to the above embodiment for details, and is not repeated in this embodiment of the present disclosure.

In step 1506a, a light shielding layer is formed on the first substrate on which the first pattern is formed and obtain the OLED display panel.

Exemplarily, the light shielding layer 107 may be formed on the structure shown in FIG. 20 to obtain the OLED display panel shown in FIG. 2. An orthographic projection of the light shielding layer 107 on the first substrate 103 at least covers an orthographic projection of a gap of the reflective blocks on the first substrate 103.

In summary, since the reflective layer of the OLED display panel manufactured by the method provided by this embodiment of the present disclosure includes at least one reflective block connected to the touch integrated circuit, the touch integrated circuit may take the at least one reflective block as a touch electrode to achieve the touch function of the OLED display panel. Therefore, the OLED display panel can have a touch function without the need for an additional touch module, and the OLED display panel can be lighter and thinner.

It should be noted that the manufacturing method shown in FIG. 15 takes the manufacture of the OLED display panel shown in FIG. 2 as an example. Optionally, when the OLED display panel shown in FIG. 13 is manufactured, the OLED display panel may not include the insulation layer 106. The second pattern in step 1503a does not include a structure for connecting to any structure of a film layer where the reflective layer is located. For example, the second pattern does not include the first conductive bridges, the second conductive bridges, the first connecting lines, and the second connecting lines. In addition, steps 1504a to 1506a in FIG. 15 may be replaced by steps 1504b to 1506b in FIG. 21.

Figure 21:
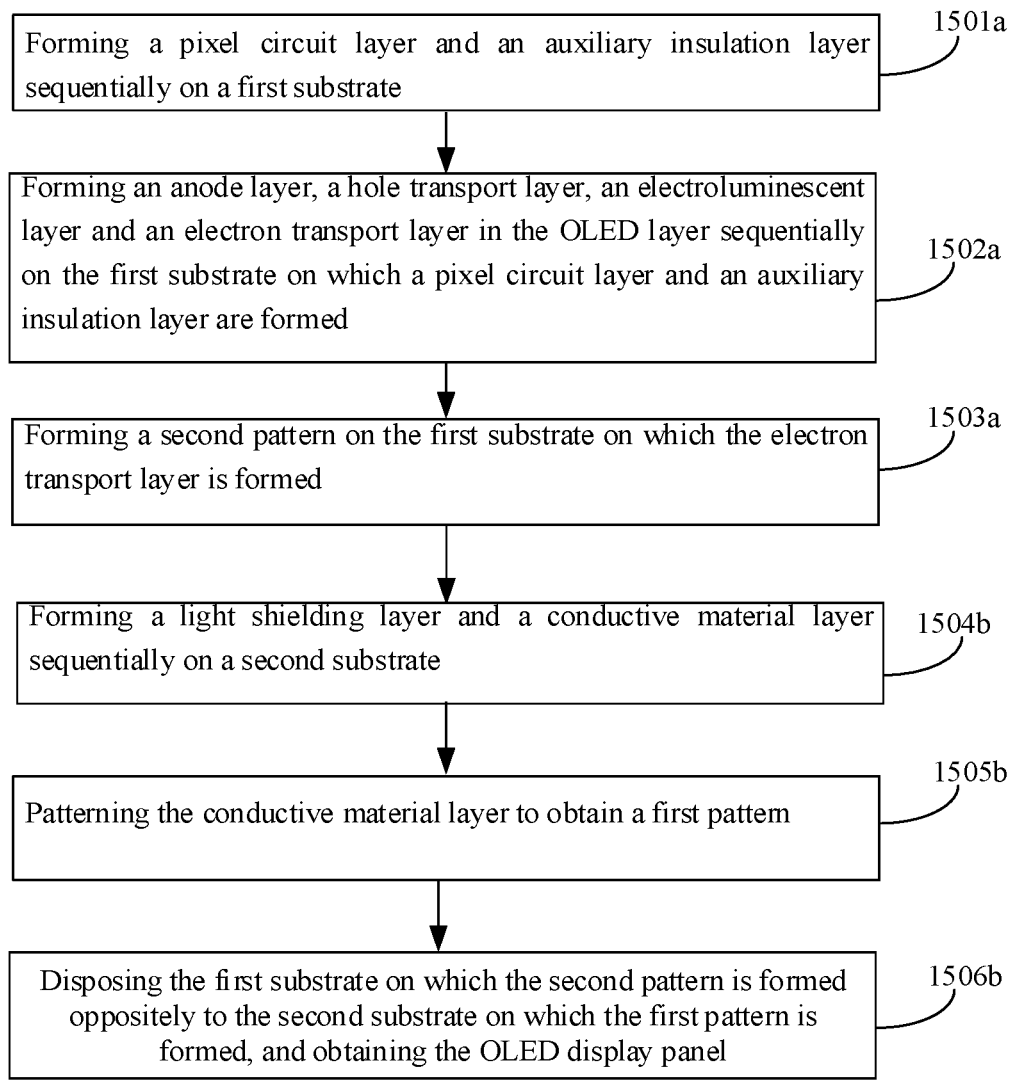
FIG. 21 is a flowchart of a manufacturing method for yet another OLED display panel provided by an embodiment of the present disclosure.

As shown in FIG. 21, after step 1503a, the method may further include the following steps.

In step 1504b, a light shielding layer and a conductive material layer are sequentially formed on a second substrate.

In step 1505b, the conductive material layer is patterned to obtain a first pattern.

The first pattern may refer to the explanation of the first pattern in this embodiment shown in FIG. 12, but the first pattern needs to include first conductive bridges, second conductive bridges, first connecting lines and second connecting lines. Exemplarily, after the light shielding layer 107 and the first pattern are formed on the second substrate 108, the structure shown in FIG. 22 may be obtained.

In step 1506b, the first substrate on which the second pattern is formed is disposed oppositely to the second substrate on which the first pattern is formed and obtain the OLED display panel.

Figure 22:
FIG. 22 is a schematic partial structural diagram of still yet another OLED display panel provided by an embodiment of the present disclosure.

Exemplarily, the structure shown in FIG. 18 may be disposed oppositely to the structure shown in FIG. 22 and thus obtain the OLED display panel shown in FIG. 13.

In summary, since the reflective layer of the OLED display panel manufactured by the method provided by this embodiment of the present disclosure includes at least one reflective block connected to the touch integrated circuit, the touch integrated circuit may take the at least one reflective block as a touch electrode to achieve the touch function of the OLED display panel. Therefore, the OLED display panel can have a touch function without the need for an additional touch module, and the OLED display panel can be lighter and thinner.

An embodiment of the present disclosure further provides a display apparatus, which may include an OLED display panel as shown in any one of FIG. 1 to FIG. 14. Exemplarily, the display apparatus provided by this embodiment of the present disclosure may be any product or component having a display function, such as a mobile phone, a tablet computer, a television, a display, a notebook computer, a digital photo frame, a navigator, or the like.

It should be noted that the manufacturing method embodiments and the corresponding OLED display panel embodiments of the present disclosure may be cross referenced, which is not limited in the embodiments of the present disclosure. The sequence of the steps in the method embodiments may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An OLED (organic light-emitting diode) display panel, comprising a pixel circuit layer, an OLED layer, and a reflective layer that are sequentially stacked,
    wherein the reflective layer comprises at least one reflective block, and the at least one reflective block is a conductor and is connected to a touch integrated circuit;
    wherein the OLED display panel further comprises a target conductive layer insulated from the reflective layer, and the target conductive layer comprises at least one electrode block connected to the touch integrated circuit;
    wherein the at least one electrode block is in one-to-one correspondence to the at least one reflective block, and an orthographic projection of the electrode block on an installation surface of the reflective layer is located within an orthographic projection of the corresponding reflective block on the installation surface; and
    wherein the reflective layer is located within a light-emission area of the OLED layer and reflects light emitted by the OLED layer.

2. The OLED display panel according to claim 1, further comprising: at least one target connecting line in one-to-one correspondence to the at least one reflective block,
    wherein the at least one reflective block is connected to the touch integrated circuit through the at least one target connecting line corresponding to the at least one reflective block.

3. The OLED display panel according to claim 2, wherein the target connecting line is in the same layer as the reflective layer.

4. The OLED display panel according to claim 1, wherein a number of reflective blocks in the at least one reflective block is greater than 1, and the OLED display panel further comprises a plurality of first conductive bridges and a plurality of second conductive bridges;
    the first conductive bridges and the second conductive bridges are all located at a gap of the at least one reflective block, and each of the first conductive bridges and each of the second conductive bridges connect two reflective blocks; and
    the first conductive bridges are insulated from the second conductive bridges, and at least a part of the first conductive bridges are intersected with at least a part of the second conductive bridges.

5. The OLED display panel according to claim 4, wherein the reflective layer comprises m rows and n columns of reflective blocks, in which $m \geq 2$, $n \geq 2$, and the at least one reflective block is at least a part of the reflective blocks in the m rows and n columns of reflective blocks;
    the reflective blocks of odd-numbered rows in a $j^{th}$ column are connected to the reflective blocks of even-numbered rows in a $(j+1)^{th}$ column through the first conductive bridges, in which $1 \leq j \leq n$, and j is an odd number; and
    the reflective blocks of even-numbered columns in an $i^{th}$ row are connected to the reflective blocks of odd-numbered columns in an $(i+1)^{th}$ row through the second conductive bridges, in which $1 \leq i \leq m$, and i is an odd number.

6. The OLED display panel according to claim 4, wherein the reflective layer comprises m rows and n columns of reflective blocks, in which $m \geq 2$, $n \geq 2$, and
    the reflective blocks in an $i^{th}$ row and a $j^{th}$ column are connected to the reflective blocks in an $(i+1)^{th}$ row and a $(j+1)^{th}$ column through the first conductive bridges, and the reflective blocks in the $i^{th}$ row and the $(j+1)^{th}$ column are connected to the reflective blocks in the $(i+1)^{th}$ row and in the $j^{th}$ column through the second conductive bridges, in which $1 \geq i \geq m$, $1 \geq j \geq n$.

7. The OLED display panel according to claim 4, wherein the first conductive bridges are located in the same layer as the reflective layer, and the second conductive bridges are located in a different layer from the reflective layer; or
the second conductive bridges are located in the same layer as the reflective layer, and the first conductive bridges are located in a different layer from the reflective layer.

8. The OLED display panel according to claim 7, wherein the conductive bridges, which are located in a different layer from the reflective layer, in the first conductive bridges and the second conductive bridges are located in the same layer as an electrode layer in the OLED layer of the OLED display panel close to the reflective layer.

9. The OLED display panel according to claim 4, wherein the plurality of first conductive bridges and the reflective blocks connected to the plurality of first conductive bridges form at least one first conductive structure, and the plurality of second conductive bridges and the reflective blocks connected to the plurality of second conductive bridges form at least one second conductive structure; and
the OLED display panel further comprises at least one first connecting line and at least one second connecting line which are connected to the touch integrated circuit; and the at least one first connecting line is connected to the at least one first conductive structure in a one-to-one correspondence manner, and the at least one second connecting line is connected to the at least one second conductive structure in a one-to-one correspondence manner.

10. The OLED display panel according to claim 9, wherein, in the at least one first connecting line and the at least one second connecting line, a part of the connecting lines are located in the same layer as the reflective layer, and the other part of the connecting lines are located in a different layer from the reflective layer; or
the at least one first connecting line and the at least one second connecting line are both located in the same layer as the reflective layer; or
the at least one first connecting line and the at least one second connecting line are both located in a different layer from the reflective, layer.

11. The OLED display panel according to claim 10, wherein when the at least one first connecting line and the at least one second connecting line comprise at least one connecting line located in a different layer from the reflective layer, the at least one connecting line is located in the same layer as the electrode layer in the OLED layer of the OLED display panel close to the reflective layer.

12. The OLED display panel according to claim 1, further comprising at least one electrode connecting line in one-to-one correspondence to the at least one electrode block, wherein the electrode block is connected to the touch integrated circuit through the corresponding target connecting line.

13. The OLED display panel according to claim 12, wherein the electrode connecting line is in the same layer as the target conductive layer.

14. The OLED display panel according to claim 1, wherein the target conductive layer comprises an electrode layer in the OLED layer of the OLED display panel close to the reflective layer.

15. The OLED display panel according to claim 1, wherein the OLED display panel further comprises a first substrate and an insulation layer; and the pixel circuit layer, the OLED layer, the insulation layer and the reflective layer are sequentially arranged in a direction away from the first substrate; or
the OLED display panel further comprises a first substrate and a second substrate; the first substrate is opposite to the second substrate; the pixel circuit layer and the OLED layer are located on one side of the first substrate close to the second substrate, and are sequentially arranged in a direction close to the second substrate; and the reflective layer is located on one side of the second substrate close to the first substrate.

16. A method for manufacturing an OLED display panel, comprising:
forming the OLED display panel, wherein a reflective layer of the OLED display panel comprises at least one reflective block which is a conductor and is connected to a touch integrated circuit;
wherein the OLED display panel comprises a pixel circuit layer, an OLED layer, and a reflective layer that are sequentially stacked;
wherein the OLED display panel further comprises a target conductive layer insulated from the reflective layer, and the target conductive layer comprises at least one electrode block connected to the touch integrated circuit;
wherein the at least one electrode block is in one-to-one correspondence to the at least one reflective block, and an orthographic projection of the electrode block on an installation surface of the reflective layer is located within an orthographic projection of the corresponding reflective block on the installation surface; and
wherein the reflective layer is located within a light-emission area of the OLED layer and reflects light emitted by the OLED layer.

17. A display apparatus, comprising the OLED display panel according to claim 1.

18. The display apparatus according to claim 17, further comprising a touch integrated circuit, wherein the at least one reflective block in the OLED display panel is connected to the touch integrated circuit respectively.

* * * * *